US011171606B2

(12) United States Patent
Dolfi et al.

(10) Patent No.: US 11,171,606 B2
(45) Date of Patent: Nov. 9, 2021

(54) RADIO FREQUENCY OSCILLATOR

(71) Applicants: THALES, Courbevoie (FR); Centre national de la recherche scientifique, Paris (FR); Université de Paris, Paris (FR)

(72) Inventors: Daniel Dolfi, Palaiseau (FR); Sylvain Combrie, Palaiseau (FR); Loic Morvan, Palaiseau (FR); Remy Braive, Paris (FR); Isabelle Robert, Paris (FR); Jean-Charles Beugnot, Paris (FR); Sarah Benchabane, Paris (FR); Vincent Laude, Paris (FR)

(73) Assignees: THALES, Courbevoie (FR); CENTRE NATIONAL DE LA RECHERCHE SCIENTIFIQUE, Paris (FR); UNIVERSITÉ DE PARIS, Paris (FR)

( * ) Notice: Subject to any disclaimer, the term of this patent is extended or adjusted under 35 U.S.C. 154(b) by 0 days.

(21) Appl. No.: 16/756,799

(22) PCT Filed: Oct. 17, 2018

(86) PCT No.: PCT/EP2018/078410
§ 371 (c)(1),
(2) Date: Apr. 16, 2020

(87) PCT Pub. No.: WO2019/076983
PCT Pub. Date: Apr. 25, 2019

(65) Prior Publication Data
US 2021/0058033 A1    Feb. 25, 2021

(30) Foreign Application Priority Data
Oct. 17, 2017    (FR) .................................... 17 01082

(51) Int. Cl.
H01S 1/06    (2006.01)
H03B 17/00   (2006.01)
(Continued)

(52) U.S. Cl.
CPC ............... *H03B 17/00* (2013.01); *G02F 1/21* (2013.01); *H01L 41/047* (2013.01);
(Continued)

(58) Field of Classification Search
CPC    H03B 17/00; G02F 1/21; G02F 1/212; H01L 41/047; H01L 41/113; H01S 5/1096
(Continued)

(56) References Cited

U.S. PATENT DOCUMENTS 4,733,561 A    3/1988 Gilby
2012/0294564 A1    11/2012 Bhave et al.
(Continued)

FOREIGN PATENT DOCUMENTS

EP    3112879 A1    1/2017

OTHER PUBLICATIONS

French Search Report issued by the French Patent Office in corresponding French Patent Application No. 1701082, dated Jun. 26, 2018.
(Continued)

*Primary Examiner* — Richard Tan
(74) *Attorney, Agent, or Firm* — Arent Fox LLP

(57) ABSTRACT

This oscillator comprises: a source generating an incident optical wave at a pulsation frequency ω; an optomechanical resonator, having optical resonances at the pulsation frequency ω and mechanical resonances at a frequency $f_1$ and generating, from the incident optical wave, emergent optical waves at the pulsation frequencies ω and $\omega - 2\pi f_1$, and an acoustic wave at frequency $f_1$; and, a photodiode delivering a useful signal at frequency $f_1$ from the emergent waves.

(Continued)

This oscillator further comprises: an acoustic propagation means for propagating the acoustic wave over a distance in order to produce a delayed acoustic wave; a means for converting the delayed acoustic wave into a delay signal at the frequency $f_1$; and, a control loop, processing the delay signal in order to obtain a control signal applied to the source.

7 Claims, 3 Drawing Sheets

(51) Int. Cl.
    *G02F 1/21*     (2006.01)
    *H01L 41/047*     (2006.01)
    *H01L 41/113*     (2006.01)
    *H01S 5/10*     (2021.01)

(52) U.S. Cl.
    CPC ............ *H01L 41/113* (2013.01); *G02F 1/212* (2021.01); *H01S 5/1096* (2013.01)

(58) Field of Classification Search
    USPC ........................................................ 331/94.1
    See application file for complete search history.

(56) References Cited

U.S. PATENT DOCUMENTS

2014/0313559 A1    10/2014    Lipson et al.
2017/0089944 A1     3/2017    Duraffourg

OTHER PUBLICATIONS

International Search Report issued by the International Searching Authority corresponding to International Patent Application No. PCT/EP2018/078410, dated Jan. 11, 2019.

RADIO FREQUENCY OSCILLATOR

CROSS-REFERENCE TO RELATED APPLICATIONS

This application is a National Stage entry of International Application No. PCT/EP2018/078410, filed on Oct. 17, 2018, which claims priority to French Patent Application No. 17 01082, filed on Oct. 17, 2017. The disclosures of the priority applications are hereby incorporated in their entirety by reference.

The present invention relates to the field of radiofrequency, or RF, oscillators. The RF domain typically extends between 1 and 100 GHz.

Figure 1:
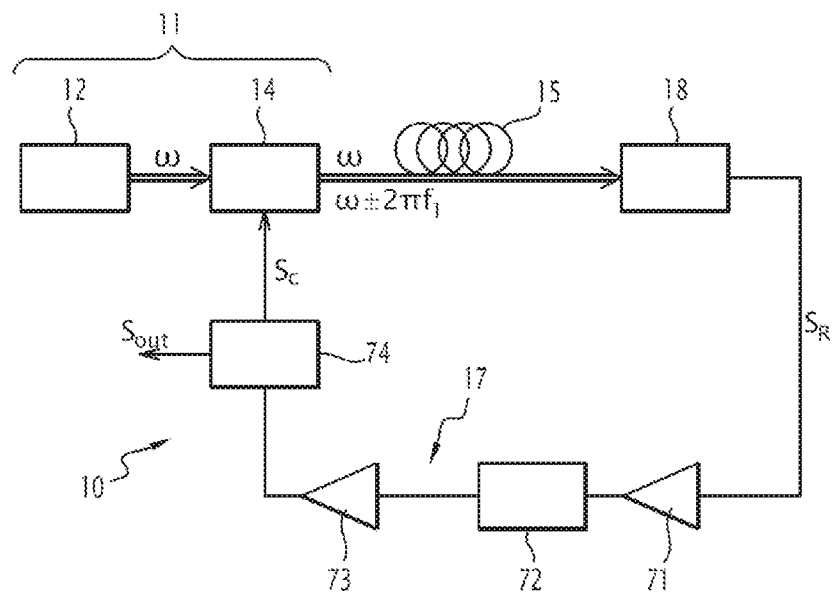

The article by X. S. YAO and L. MALEKI, "Optoelectronic oscillator for photonic systems," IEEE J. Quantum Electron., vol. 32, no. 7, pp. 1141-1149, 1996, discloses an RF oscillator of the optoelectronic type. As shown in FIG. 1, this oscillator 10, which constitutes a wideband optoelectronic link with external modulation, looped on itself, includes:

- a controlled source 11, made up of a laser 12, able to generate a mono-frequency light beam, the optical wave of which has a pulsation $\omega$; and a rapid modulator 14, able to modulate the mono-frequency light beam of the laser 12, according to a command signal Sc with frequency $f_1$, so as to generate a modulated light beam including optical waves at the pulsation frequencies w and $\omega \pm 2\pi f_1$;
- an optical fiber 15, forming a delay line for the modulated light beam generated by the controlled source, the length L of which is suitable for delaying the optical waves passing through it;
- a rapid photodiode 18, able to deliver an electrical signal at the frequency $f_1$ from the emergent delayed light beam of the fiber 15; and
- a control loop 17, processing the electrical signal delivered at the output of the photodiode 18 in order to obtain a feedback signal applied as control signal to the modulator 14.

The control loop 17 includes filtering means (such as a resonant cavity 72) and amplification means (such as a low-noise amplifier 71 at the input of the cavity and a high-power amplifier 73 at the output of the cavity), as well as a coupler 74, a first output of which is connected to the control terminal of the modulator 14 and a second output of which carries the wanted signal Sout generated by the oscillator 10. The wanted signal Sout oscillates at the frequency $f_1$.

When the oscillating conditions are reached (that is to say, when the total gain of the loop is sufficient), the quality factor Q of such an oscillator is a function of the ratio between the length L of the optical fiber 15 to the wavelength $\Lambda$ in the vacuum associated with the oscillating frequency $f_1$.

Thus, for an oscillation at a frequency $f_1$ in the RF domain, for example of 10 GHz ($\Lambda$=3 cm) and with a length L=3 km, a quality factor Q of $10^5$ is achieved. This quality factor is interesting in that it makes it possible to generate wanted signals of high spectral quality (typically −145 dBc/Hz at 10 kHz from the carrier).

However, the final volume of such an optoelectronic RF oscillator is on the order of 0.5 to 1 liter, due to the winding constraints of the optical fiber. This is a handicap for some embedded applications, in radar antennas for instance.

Additionally, the significant length of the optical fiber makes the oscillator relatively sensitive to temperature variations and vibrations, which is a drawback for embedded applications.

This may be partially resolved by replacing the optical fiber with an optical resonator. The latter introduces a delay between the incident optical wave and the emergent optical wave. At this time, the only optical resonators that have sufficient overvoltage coefficients, typically on the order of $10^8$, are three-dimensional resonators.

However, the coupling between the modulator and the optical resonator, on the one hand, and the necessary locking of the wavelength of the laser to that of the optical resonator, on the other hand, are critical and are also relatively sensitive to the environment (the temperature, vibrations, etc.).

Furthermore, stabilized oscillators (also called locked oscillators) incorporating an optomechanical resonator exist. Such a resonator implements coupling between an optical resonance and a mechanical resonance. The emergent optical beam of the resonator is used to develop feedback in the low-frequency domain and to apply it to the laser (frequency and/or power) in order to stabilize the operating point of the oscillator with respect to slow drifts of the oscillation frequency (temperature, vibrations, etc.). However, the mechanical quality factors remain low, and their spectral purity is therefore low.

Furthermore, document EP 3,112,879 A1 discloses a radiofrequency oscillator, including: a controlled source able to generate an incident light beam including at least one optical wave at a reference pulsation $\omega$; an optomechanical resonator, having an optical resonance at the reference pulsation $\omega$ and a mechanical resonance at a reference frequency $f_1$, the optomechanical resonator being able, from the incident light beam, to generate an emergent light beam including optical waves at the pulsation frequencies $\omega$ and $\omega - 2\pi f_1$, on the one hand, and an acoustic wave at the reference frequency $f_1$, on the other hand; a photodiode, able to deliver a working electrical signal at the reference frequency $f_1$ from the emergent light beam of the optomechanical resonator.

The aim of the present invention is to address the aforementioned problems.

To that end, the invention relates to a radiofrequency oscillator, including:
- a controlled source able to generate an incident light beam including at least one optical wave at a reference pulsation frequency $\omega$;
- an optomechanical resonator, having an optical resonance at the reference pulsation $\omega$ and a mechanical resonance at a reference frequency $f_1$, the optomechanical resonator being able, from the incident light beam, to generate an emergent light beam including optical waves at the pulsation frequencies $\omega$ and $\omega - 2\pi f_1$, on the one hand, and an acoustic wave at the reference frequency $f_1$, on the other hand;
- a photodiode, able to deliver a working electrical signal at the reference frequency $f_1$ from the emergent light beam of the optomechanical resonator, characterized in that it includes:
- an acoustic propagation means able to take off the acoustic wave generated by the optomechanical resonator and propagate it over a predetermined propagation distance in order to introduce a delay therein so as to produce a delayed acoustic wave;
- a conversion means able to convert the delayed acoustic wave at the output of the propagation means into an electrical delay signal having an oscillation frequency equal to the reference frequency $f_1$; and a control loop, able to process the delay signal in order to obtain an electrical control signal applied to the source, the electrical control signal having an oscillation frequency equal to the reference frequency $f_1$.

The present invention also implements an optomechanical resonator, that is to say, a device that combines an optical resonance, a mechanical resonance and coupling between them.

However, the present invention proposes an original scheme allowing a spectral refinement (that is to say, an increase in the spectral purity) of an optomechanical oscillator by a delayed reinjection of the high-frequency signal, the delay no longer being done by the propagation of an optical wave (in an optical fiber or an optical resonator), but by the propagation of an acoustic wave (in an acoustic waveguide, for example) generated optically in the optomechanical resonator.

The delayed acoustic wave is next collected, in the electrical domain, by a suitable means performing a conversion of the acoustic wave into an electrical signal (voltage or current). This is for example a means implementing a piezoelectric effect or a capacitive effect. This conversion can be done through a physical property of the component material of the optomechanical resonator or through a suitable structure that is attached on the optomechanical resonator. The electrical signal thus generated is then reinjected so as to modulate the optical wave entering the optomechanical resonator.

Thus, the oscillator appears as an opto-acousto-electronic RF oscillator.

According to particular embodiments, one or another of the preceding oscillators includes one or more of the following features, considered alone or according to any technically possible combinations:

- the source includes: a mono-frequency laser, able to generate a light beam including an optical wave at the reference pulsation frequency $\omega$; and a modulator able to modulate the optical wave of the light beam generated by the mono-frequency laser according to said electrical control signal in order to obtain, as output, an incident light beam modulated so as to include optical waves at the pulsation frequency $\omega$ and at the pulsation frequencies $\omega+2\pi f_1$ and/or $\omega-2\pi f_1$;
- the source is a dual frequency laser, able to generate, according to said control signal, an incident light beam including optical waves at the pulsation frequency $\omega$ and at the pulsation frequencies $\omega+2\pi f_1$ and/or $\omega-2\pi f_1$.
- the propagation means being a first propagation means able to produce a first acoustic wave delayed by a first delay and the conversion means being a first conversion means able to deliver a first electrical delay signal from the first delayed acoustic wave, the oscillator further includes a second propagation means able to take off the acoustic wave generated by the optomechanical resonator and to propagate it over a predetermined propagation distance to introduce a second delay therein so as to produce a second delayed acoustic wave and a second conversion means able to deliver a second electrical delay signal from the second delayed acoustic wave, the control loop including a means for determining an electrical error signal determined from first and second electrical delay signals, the control signal being developed from the error signal.
- the optomechanical resonator, the acoustic propagation means and the conversion means are integrated on a same chip.
- the acoustic propagation means is a waveguide tuned to the reference frequency $f_1$.
- the conversion means includes a piezoelectric material and interdigitated electrodes.

In light of the usual speeds of acoustic propagation in the materials, it is possible to produce a delay equivalent to that of an optical fiber of several hundred meters over a distance of several millimeters. The functions of the RF oscillator described above have the advantage of being able to be integrated on a single chip (also called integrated circuit) with small dimensions (several tens of square millimeters) with collective and planar production technologies.

Figure 2:
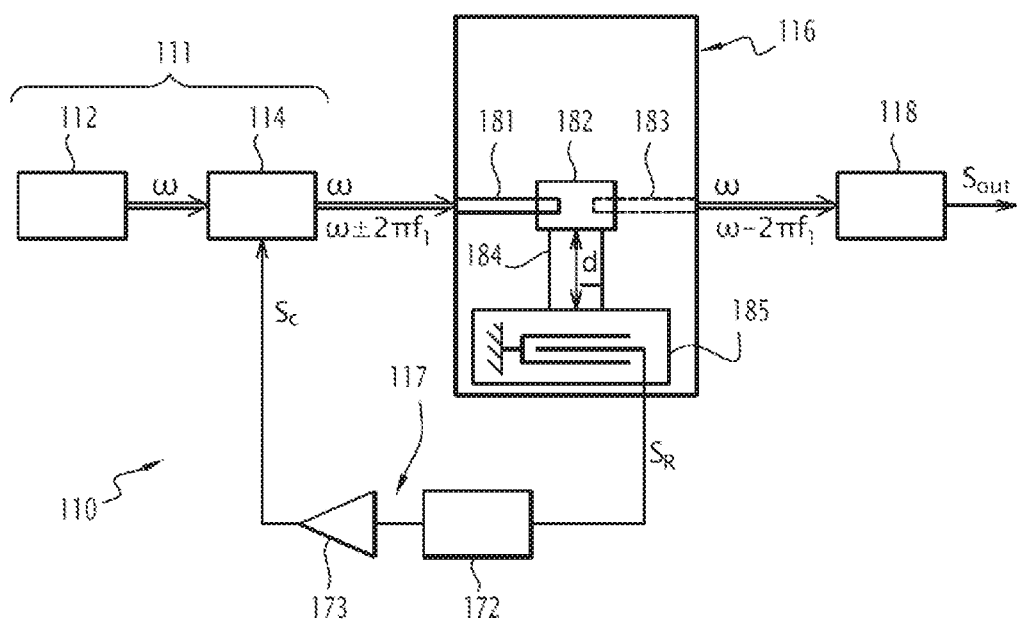
Figure 3:
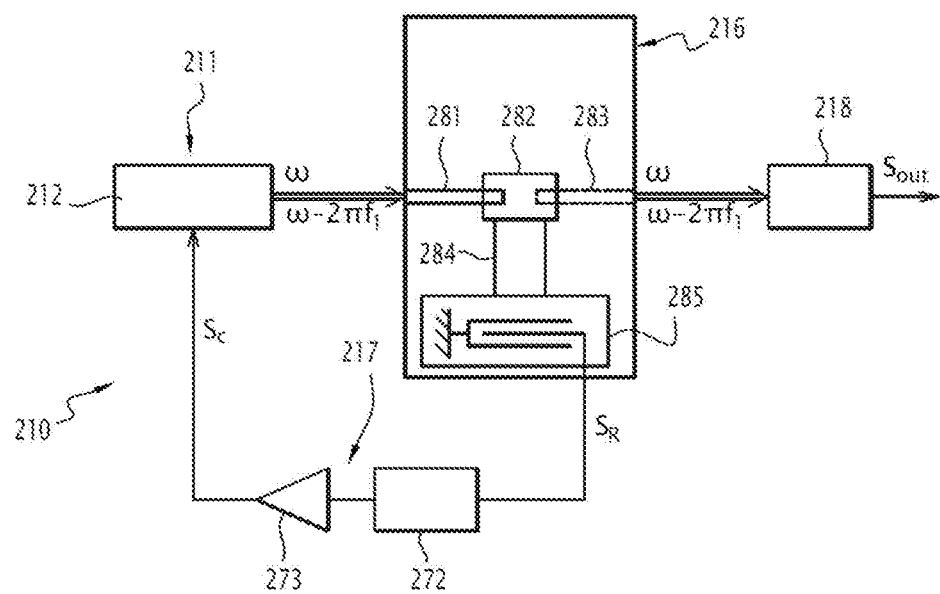
Figure 4:
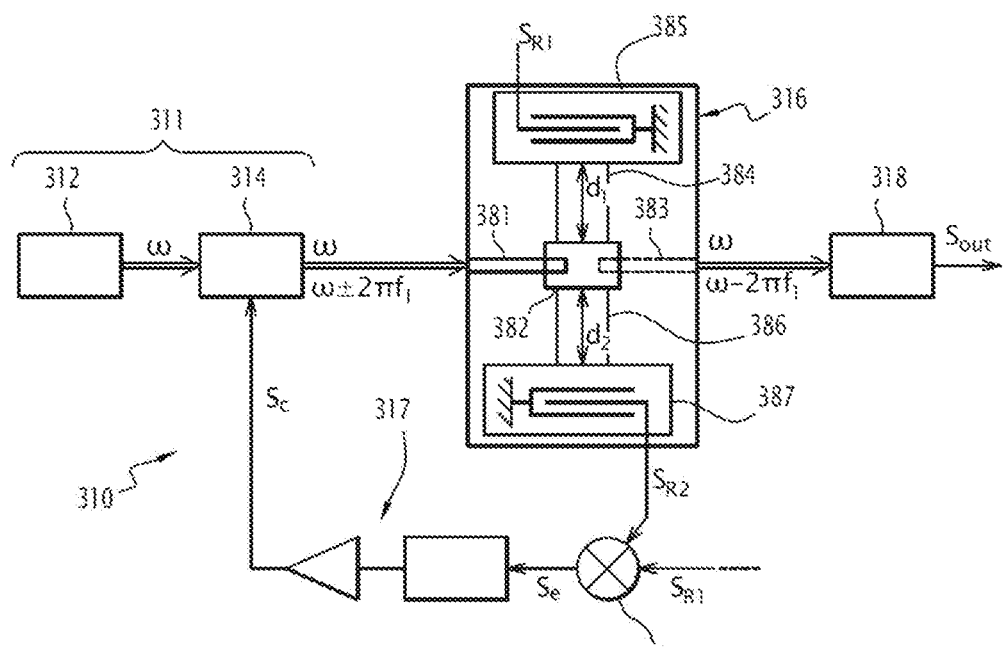
Figure 5:
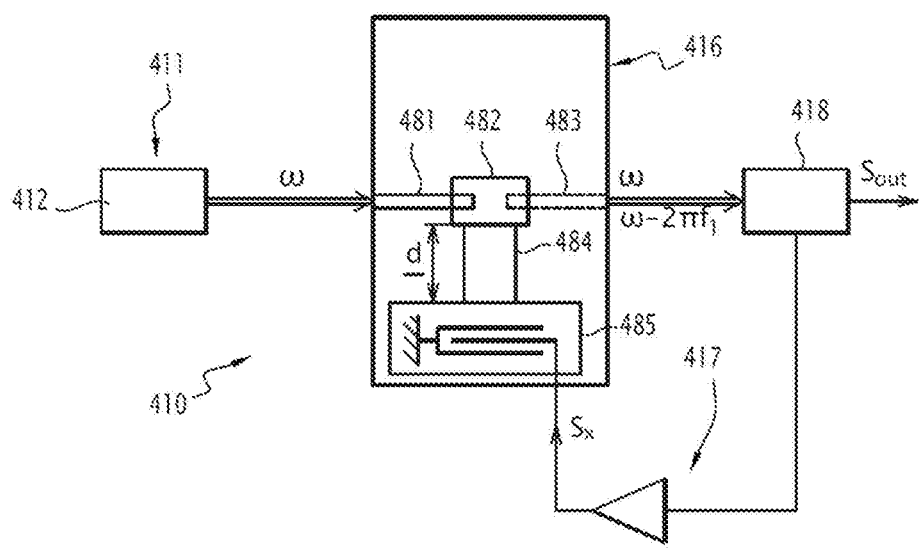

The invention and its advantages will be better understood upon reading the following detailed description of several specific embodiments of the invention, provided solely as illustrative and non-limiting examples. This description is done in reference to the appended drawings, in which:

FIG. 1 schematically shows an oscillator according to the state of the art;

FIG. 2 schematically shows a first embodiment of an oscillator according to the invention;

FIG. 3 schematically shows a second embodiment of an oscillator according to the invention;

FIG. 4 schematically shows a third embodiment of an oscillator according to the invention; and FIG. 5 schematically shows a fourth embodiment of an oscillator that is not according to the invention.

In reference to FIG. 2, the structure of one currently preferred embodiment of a radiofrequency oscillator according to the invention will be described.

The radiofrequency oscillator 110 includes a controlled source 111, an opto-acoustoelectric device 116, a feedback loop 117 and a photodiode 118.

More specifically, the controlled source 111 is made up of a laser 112 and a modulator 114.

The laser 112 is a mono-frequency laser, able to generate an incident light beam including an optical wave at a pulsation frequency $\omega$. The laser 112 is for example of the DFB (distributed feedback laser) laser diode type or of the diode-pumped solid-state laser type. It is able to generate a laser beam whereof the light for example has a wavelength of 1.5 μm. The laser beam at the output of the laser 112 is applied at the input of the modulator 114.

The modulator 114 is fast and able to modulate the optical wave of the laser beam emitted by the laser 112 according to a control signal Sc having a frequency $f_1$, so as to generate, as output, a modulated laser beam having optical waves at the pulsation frequencies $\omega$ and to $\omega \mp 2\pi f_1$.

For example, the modulator 114 is a rapid electro-optical modulator, the bandwidth of which is compatible with the desired RF oscillation frequency (typically, $f_1$=10 GHz). The modulator 114 is preferably an intensity modulator, for example of the Mach-Zehnder type. In a variant, it could also be a phase modulator or a single sideband modulator. The modulator 114 is able to modulate the intensity or the phase of the incident laser beam according to the voltage level of the control signal Sc applied on a control terminal of the modulator 114. A modulated light beam is obtained at the output of the modulator 114.

The modulated light beam at the output of the modulator 114 is applied at the input of the device 116.

The opto-acoustoelectric device 116 includes an optomechanical resonator 182, an acoustic guide 184 and a mechanical/electrical transducer 185.

The optomechanical resonator 182 has both an optical resonance at the pulsation frequency ω, and a mechanical resonance at the frequency $f_1$, these resonances being coupled with one another. From an incident optical beam at a pulsation frequency close to the pulsation frequency ω, the resonator 182 is able to generate a mechanical oscillation at its natural mechanical resonance frequency $f_1$, as well as an emergent light beam including optical waves at the pulsation frequencies ω and ω−2π$f_1$.

Such an optomechanical resonator is for known and is for example described in detail in the article by Markus Aspelmeyer et al. titled "Cavity optomechanics", Reviews of Modern Physics, Vol. 86, October-December 2014.

The optomechanical resonator 182 is a membrane in that its thickness dimension (for example of 250 nm) is reduced relative to its length and width dimensions.

This membrane is made from a material structured on the nanoscale so as to have a periodic optical pattern (making it possible to define a photonic bandgap), the periodicity of which is altered so as to have a defect in order to form an optical cavity with a high spectral exactitude.

The photonic structuring of the membrane makes it possible to excite (via an optomechanical coupling of the radiation pressure, stimulated Brillouin scattering, etc. type) a mechanical vibration, from a light beam having a low optical power level (typically of several 10 mW). Thus, owing to this optomechanical effect, the optical waves of the incident light beam excite, in the resonator 182, mechanical vibration modes, that is to say, acoustic waves.

In return, these acoustic waves locally modify the effective optical index of the membrane. This modification of the index, which is variable over time, creates secondary optical waves from optical waves of the incident light beam. These secondary optical waves have different optical frequencies from those of the optical waves of the incident beam.

Thus, when an equilibrium is found, if the pulsation frequency of the optical wave of the incident beam is ω and if the frequencies of the mechanical vibration modes of the membrane are $f_1, f_2, \ldots, f_i, \ldots$, the emergent light beam is made up of optical waves having pulsation frequencies: ω; ω−2π$f_1$; ω−2π$f_2$; ...; ω−2π$f_i$; ... etc. Normally, only lower sidebands are produced, but it is not precluded that some materials make it possible to obtain upper sidebands.

Furthermore, the material of the component membrane of the resonator 182 is preferably structured according to an acoustic pattern. The latter is for example obtained by producing nano-perforations of the membrane. Each perforation may then be considered an acoustic impedance rupture, such that the material of the membrane makes up a phononic crystal. The material then associating optical and acoustic functions is called "phoxonic".

The acoustic structure of the membrane is able to provide the filtering of a favored mechanical vibration mode and the confinement of a favored optical wave. The acoustic structuring of the membrane is thus chosen so as to favor the mechanical vibration mode characterized by the frequency $f_1$.

Thus, in an established regime, the acoustic wave at the frequency $f_1$ is reinforced and is selected from the different possible acoustic waves. At the same time, the optical wave at the pulsation frequency ω−2π$f_1$ is favored. Thus, at the output of the resonator 182 and therefore of the device 116, there is an emergent beam containing the optical waves with pulsation frequency ω and ω−2π$f_1$.

Furthermore, the acoustic wave with frequency $f_1$ is used to generate a delay signal Sr.

To that end, the acoustic guide 184 of the device 116 is able to take out the acoustic wave with frequency $f_1$ generated in the component membrane of the optomechanical resonator 182 and to guide it over a distance d toward the mechanical/electrical transducer 185.

The propagation time of the acoustic wave with frequency $f_1$ through the acoustic guide 184 introduces a delay T. In light of the speed of the acoustic wave (on the order of 3000 m·s$^{-1}$) in the component material of the waveguide, a delay is obtained on the order of 1 μs for a distance d of 3 mm.

The material of the acoustic guide 184 advantageously has a nano-phononic structure that slows and filters this acoustic wave. For example, it is structured in the form of a phononic bandgap material so as to slow the acoustic wave at the frequency $f_1$, typically to values of 400 m·s$^{-1}$. Such a material is for example described in the article by Fang, Kejie, et al. "Phonon routing in integrated optomechanical cavity-waveguide systems." arXiv preprint arXiv:1508.05138 (2015). In this case, a delay of 1 μs is obtained for a propagation distance d of 0.4 mm. It should be noted that in an optoelectronic oscillator architecture according to the state of the art, the same delay is obtained with 200 m of optical fiber.

Lastly, at the other end of the acoustic guide 184, the mechanical/electrical transducer 185 serves to convert the delayed acoustic wave with frequency $f_1$ into an electrical signal Sr, which has an oscillation frequency equal to the favored frequency $f_1$. This may for example be obtained by choosing the component material of the substrate of the transducer 185 such that it is piezoelectric. The substrate then bears, on the surface, a set of interdigitated electrodes. This set of electrodes is tuned to the frequency $f_1$.

Preferably, the device 116 also includes an optical input guide 181 and an optical output guide 183, which are positioned near the resonator 182. The optical input guide serves to guide the incident light beam, generated by the controlled source 111 and applied at the input of the device 116, to the resonator 182. The coupling between the guide 181 and the resonator 182 is done by evanescent waves. Symmetrically, the optical output guide 183 serves to guide the emergent light beam of the resonator 182 to the output of the device 116, toward the diode 118. The coupling between the guide 182 and the resonator 183 is done by evanescent waves. Advantageously, the optical guides can be made directly in the component membrane of the resonator 182.

In one particularly advantageous variant, the different functionalities of the device 116 are integrated on a same chip. The component materials of the membrane of the resonator 182, the acoustic guide 184 and the substrate of the transducer 185 are then identical so as to allow simultaneous manufacturing using an appropriate technology. The considered material is for example a semiconductor III-V material, preferably Gallium Arsenide GaAs.

The photodiode 118 makes it possible to generate a working signal Sout from the emergent light beam of the device 116.

The photodiode 118 is preferably a rapid photodiode, that is to say, the bandwidth of which is greater than the frequency $f_1$. It serves to detect the frequency deviation between the two optical waves of the emergent light beam, respectively ω and ω−2π$f_1$, and to deliver, as output, an electric beat signal at the frequency $f_1$. This beat signal is the working signal $S_{out}$ delivered as output of the oscillator 110.

The photodiode 118 may advantageously be used to stabilize the operating conditions of the optomechanical resonator 182, via the power and the optical frequency of the laser. It for example makes it possible to compensate for the thermal drifts of the optical resonator that cause a discrepancy between the resonance and the excitation.

The feedback loop 117 develops the electrical control signal Sc of the modulator 114 from the electrical signal Sr delivered as output of the transducer 185. The loop 117 includes a filtering means 172 followed by an amplification means 173.

Thus, the electrical signal Sr, delayed and with frequency $f_1$, is used via the feedback loop 117, to feed the modulator 114. Therefore, reinjected into the optomechanical resonator 182 is a light beam with pulsation frequency ω modulated at the frequency $f_1$, that is to say, including optical beams at pulsation frequencies ω and $\omega \mp 2\pi f_1$.

It would also be possible to recover the radiofrequency beat signal at the output of the amplifier 173 using a coupler, identical to the coupler 74.

The two optical waves ω and $\omega - 2\pi f_1$ contained in the modulated beam injected into the resonator 182 contribute to keeping the generation of the acoustic wave at the frequency $f_1$.

In this way, the optomechanical oscillation 182 gains exactitude owing to the effective quality factor offered by the acoustic delay τ.

The oscillation at $f_1$ successively optically, mechanically and electrically provided benefits at once from an optical resonance, a mechanical resonance and an acoustic delay. The assembly therefore constitutes an RF oscillator more able to generate signals of great spectral purity than a simple optomechanical resonance.

The delay being obtained by a structure of several millimeters, the oscillator has an extremely reduced volume, in particular relative to the state of the art. The volume of the optomechanical resonator is typically of several $\mu m^3$. That of the oscillator, incorporating the delay line and the transducer, is typically 1 mm×10 μm×250 nm.

The resonator 182 also has a high optical overvoltage coefficient Q, typically on the order of $10^5$-$10^6$.

Once the electric gain and the optical power (typically 10 MW) are sufficient, it is possible to achieve maintained oscillation conditions and a spectral refinement of the electro-optomechanical oscillator 110.

The frequency $f_1$ is high, typically on the order of a GHz.

In a variant, an optical fiber can be inserted between the device 116 and the photodiode 118 in order to disrupt the RF signal on optical carrier of the emergent light beam far from the core of the oscillator 110. In this variant, the optical fiber does not play any role in the stabilization of the oscillator, unlike the state of the art.

FIGS. 3 to 5 show alternative embodiments of the invention. An element of the second, third or fourth embodiment that is identical to an element of the first embodiment is referenced in these drawing by the figure used to reference this identical element in FIG. 2, increased by one hundred for the second embodiment, two hundred for the third embodiment and three hundred for the fourth embodiment.

In the second embodiment of FIG. 3, all other things being equal, the source 211 of the oscillator 210 is a dual frequency laser 212, to replace the assembly made up of the laser 112 and the modulator 114 of the oscillator 110 of FIG. 2. In the case where the dual frequency laser is a laser diode of the type described in the article by G. Kervella et al. "Laser sources for microwave to millimeter-wave applications," Photon. Res. 2, B70-B79 (2014), the electric control signal $S_c$, of acoustic origin, can be applied directly to control the dual frequency laser and to lock, at the frequency $f_1$, the gap between the two frequencies generated by the laser. The dual frequency laser thus generates only two optical waves respectively at ω and $\omega - 2\pi f_1$.

In a variant of this second embodiment, the source 211 is a direct modulation laser.

In the third embodiment of FIG. 4, corresponding to an embodiment variant of the first embodiment of FIG. 2, the source 311 of the oscillator 310 is made up of a monofrequency laser 312 and a modulator 314.

In this embodiment, the optomechanical resonator 316 includes a first acoustic guide 384 (propagating the acoustic wave over a distance $d_1$) and a first mechanical/optical converter 385 making it possible to generate a first delay signal $S_{r1}$ having a delay τ1 and a second acoustic guide 386 (propagating the acoustic wave over a distance $d_2$) and a second mechanical/optical converter 387 making it possible to generate a second delay signal $S_{r2}$ having a delay τ2.

The two delay signals are combined in an RF adder 388. The latter then delivers an error signal $S_e$ having a reduced frequency, which takes account of the drifts of the beat frequency between two instants, separated by the time gap τ2-τ1. The error signal $S_e$ is next amplified so as to obtain the control signal $S_c$ of the source 311.

In a variant of this third embodiment, the delay τ1 is not obtained acoustically, but from the working signal $S_{out}$ at the output of the photodiode 318. The latter, which is mixed with the acoustically delayed signal $S_{r2}$, in order to generate the error feedback signal $S_e$ on the dual frequency laser.

In the fourth embodiment, which is not part of the invention and is shown in FIG. 5, the electro-optical modulator is eliminated. The optical wave of the source 411 is injected directly from the laser 412 into the resonator 482. This incident optical wave is modulated by the mechanical vibration and the emergent modulated wave is detected, at the output of the resonator 482, by the rapid photodiode 418. The working signal $S_{out}$ delivered at the output of the diode 418 is then amplified in order to obtain an excitation signal $S_x$ at the frequency $f_1$. The excitation signal $S_x$ is next applied to a set of interdigitated electrodes of a converter 485 now operating as electric-acoustic converter. It excites an acoustic wave, by piezoelectric effect, at the frequency $f_1$. This acoustic wave is taken off and guided by an acoustic guide 484 toward the resonator 482. It is this acoustic wave that will act, with a delay τ introduced by the propagation of the acoustic wave through the acoustic guide 484, on the optical cavity of the resonator 482 to modulate the optical wave.

In the fourth embodiment, an acoustic wave, generated by an electric signal, is optically "read". The detection, by the photodiode, of this modulated optical wave yields an electric signal that in turn feeds the generation of the acoustic wave. The oscillator 410 is thus closed.

This fourth embodiment is the "reverse" of that of the preceding figures, which illustrate three embodiments according to the invention. This fourth embodiment can be generalized to all three embodiments and variants of the invention previously described.

The oscillator according to the invention makes it possible to generate RF signals of great spectral purity, directly at the usage frequency, in particular without needing a multiplication chain.

The oscillator according to the invention can be made on a semiconductor chip on the order of 1 to 10 $cm^2$, compatible with embedded applications.

The present invention falls within the general field of generating RF signals of great spectral purity able to be used as local oscillator in radar systems, electronic warfare, communications, or more generally, metrology.

The invention claimed is:

1. A radiofrequency oscillator, comprising:
a controlled source able to generate an incident light beam including at least one optical wave at a reference angular frequency $\omega$;
an optomechanical resonator, having an optical resonance at the reference angular frequency $\omega$ and a mechanical resonance at a reference frequency $f_1$, the optomechanical resonator being able, from the incident light beam, to generate an emergent light beam including optical waves at a first angular frequency equal to $\omega$ and a second angular frequency equal to $\omega-2\pi f_1$ and an acoustic wave at the reference frequency $f_1$;
a photodiode, able to deliver a wanted electrical signal at the reference frequency $f_1$ from the emergent light beam of the optomechanical resonator,
an acoustic propagation means taking off the acoustic wave generated by the optomechanical resonator and propagating it over a predetermined propagation distance in order to introduce a delay therein so as to produce a delayed acoustic wave;
a conversion means converting the delayed acoustic wave at an output of the acoustic propagation means into an electrical delay signal having an oscillation frequency equal to the reference frequency $f_1$; and
a control loop, processing the electrical delay signal in order to obtain an electrical control signal applied to the controlled source, the electrical control signal having the oscillation frequency equal to the reference frequency $f_1$.

2. The radiofrequency oscillator according to claim 1, wherein the controlled source includes:
a mono-frequency laser generating a light beam including an optical wave at the reference angular frequency $\omega$; and
a modulator modulating the optical wave of the light beam generated by the mono-frequency laser according to the electrical control signal in order to obtain, as output, the incident light beam modulated so as to include a first optical wave at the reference angular frequency $\omega$, a second optical wave at an angular frequency $\omega+2\pi f_1$, and/or a third optical wave at the second angular frequency $\omega-2\pi f_1$.

3. The radiofrequency oscillator according to claim 1, wherein the controlled source is a dual frequency laser generating, according to the electrical control signal, the incident light beam including a first optical wave at the reference angular frequency $\omega$, and a second optical wave at an angular frequency $\omega+2\pi f_1$, and/or a third optical wave at the second angular frequency $\omega-2\pi f_1$.

4. The radiofrequency oscillator according to claim 1, wherein, the acoustic propagation means being a first acoustic propagation means producing a first delayed acoustic wave that is delayed by a first delay and the conversion means being a first conversion means able to deliver a first electrical delay signal from the first delayed acoustic wave, the radiofrequency oscillator further includes a second acoustic propagation means taking off the acoustic wave generated by the optomechanical resonator and to propagate it over a second predetermined propagation distance to introduce a second delay therein so as to produce a second delayed acoustic wave and a second conversion means delivering a second electrical delay signal from the second delayed acoustic wave, the control loop including a means for determining an electrical error signal from the first and second electrical delay signals, the electrical control signal being developed from the electrical error signal.

5. The radiofrequency oscillator according to claim 1, wherein the optomechanical resonator, the acoustic propagation means and the conversion means are integrated on a same chip.

6. The radiofrequency oscillator according to claim 1, wherein the acoustic propagation means is a waveguide tuned to the reference frequency $f_1$.

7. The radiofrequency oscillator according to claim 1, wherein the conversion means includes a piezoelectric material and interdigitated electrodes.

* * * * *